US008734903B2

(12) United States Patent
Nelson

(10) Patent No.: US 8,734,903 B2
(45) Date of Patent: May 27, 2014

(54) PROCESS FOR FORMING A SILICA COATING ON A GLASS SUBSTRATE

(75) Inventor: Douglas M. Nelson, Curtice, OH (US)

(73) Assignee: Pilkington Group Limited, St. Helens (GB)

( * ) Notice: Subject to any disclaimer, the term of this patent is extended or adjusted under 35 U.S.C. 154(b) by 21 days.

(21) Appl. No.: 13/604,095

(22) Filed: Sep. 5, 2012

(65) Prior Publication Data

US 2013/0071566 A1    Mar. 21, 2013

Related U.S. Application Data

(60) Provisional application No. 61/536,382, filed on Sep. 19, 2011.

(51) Int. Cl.
*C23C 16/22*    (2006.01)

(52) U.S. Cl.
USPC ............ 427/255.18; 427/255.11; 427/255.23; 427/255.28; 427/255.31; 427/255.37

(58) Field of Classification Search
None
See application file for complete search history.

(56) References Cited

U.S. PATENT DOCUMENTS

| | | | |
|---|---|---|---|
| 3,378,396 A | 4/1968 | Zaromb | |
| 4,196,232 A * | 4/1980 | Schnable et al. | 427/255.37 |
| 4,590,096 A | 5/1986 | Lindner | |
| 4,853,257 A | 8/1989 | Henery | |
| 4,922,853 A | 5/1990 | Hofer | |
| 5,168,003 A * | 12/1992 | Proscia | 428/216 |
| 5,217,753 A | 6/1993 | Goodman et al. | |
| 5,356,718 A | 10/1994 | Athey et al. | |
| 5,360,646 A | 11/1994 | Morita | |
| 5,464,657 A | 11/1995 | Athey et al. | |
| 5,599,387 A | 2/1997 | Neuman et al. | |
| 5,744,192 A | 4/1998 | Nguyen | |
| 5,762,697 A | 6/1998 | Sakamoto et al. | |
| 5,776,236 A | 7/1998 | Neuman et al. | |
| 5,798,142 A * | 8/1998 | Soubeyrand | 427/255.18 |
| 6,503,633 B2 | 1/2003 | Nishikawa et al. | |
| 6,504,139 B1 | 1/2003 | Hirata et al. | |
| 6,797,388 B1 | 9/2004 | Szanyi et al. | |
| 6,818,250 B2 | 11/2004 | George et al. | |
| 6,962,732 B2 | 11/2005 | Won et al. | |
| 7,235,500 B2 | 6/2007 | Fujii et al. | |
| 7,754,286 B2 | 7/2010 | Kawasaki | |
| RE41,799 E | 10/2010 | Russo et al. | |
| 7,897,259 B1 | 3/2011 | Lococq et al. | |
| 2012/0240627 A1 | 9/2012 | Nelson | |

FOREIGN PATENT DOCUMENTS

| | | |
|---|---|---|
| EP | 0785868 | 7/1997 |
| WO | WO2005/023723 A1 | 3/2005 |
| WO | WO2013-041840 * | 3/2013 |

OTHER PUBLICATIONS

Yasutaka Uchida, et al., Improved hydrogen free chemical vapor deposition of silicon dioxide, Journal of Non-Crystalline Solids 254, 1999, pp. 11-16, Elsevier Science B.V.

* cited by examiner

*Primary Examiner* — Joseph Miller, Jr.
(74) *Attorney, Agent, or Firm* — Marshall & Melhorn, LLC

(57) ABSTRACT

A chemical vapor deposition process for the deposition of a silica layer on a glass substrate is provided. The process includes providing a glass substrate. The process also includes forming a gaseous precursor mixture comprising a silane compound, oxygen, water vapor, and a radical scavenger and directing the precursor mixture toward and along the glass substrate. The mixture reacts over the glass substrate to form a silica coating thereon.

18 Claims, 1 Drawing Sheet

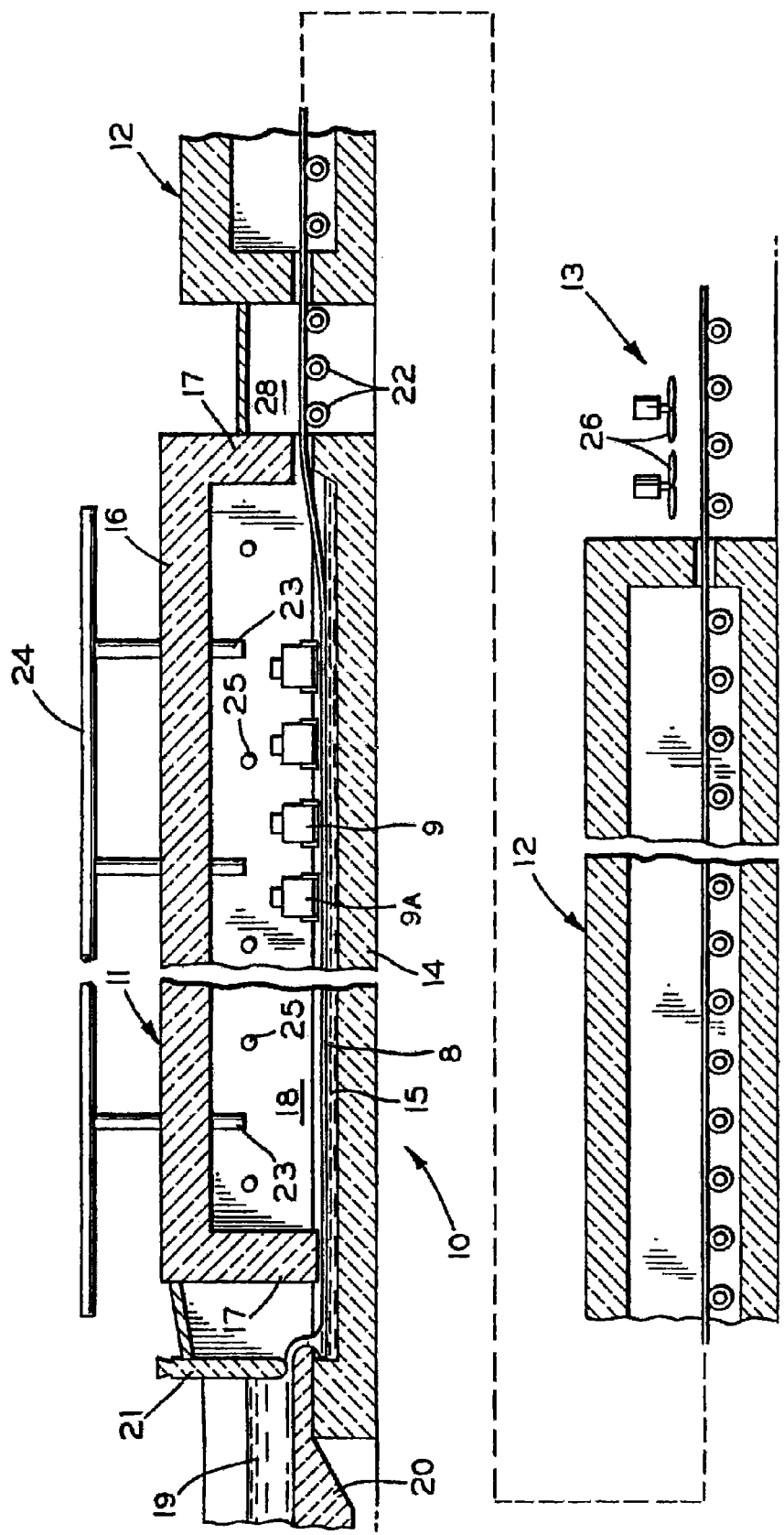

PROCESS FOR FORMING A SILICA COATING ON A GLASS SUBSTRATE

BACKGROUND OF INVENTION

This invention relates in general to a chemical vapor deposition (CVD) process for producing a coated glass article and the coated glass article formed thereby. In particular, this invention relates to a CVD process for forming a silica coating over a glass substrate and a glass article having a silica coating formed thereon.

Silica coatings are known to be deposited on glass substrates. However, the processes known for the production of the silica coatings are limited by the efficiency of the deposition process and/or by powder formation (pre-reaction) of the reactive elements. Therefore, it is desired to devise an improved process for the formation of silica coatings over glass substrates.

BRIEF SUMMARY OF THE INVENTION

A chemical vapor deposition process for depositing a silica coating is provided.

In an embodiment, the process comprises providing a glass substrate. The process also comprises forming a gaseous precursor mixture which comprises a silane compound, oxygen, water vapor, and a radical scavenger. The process comprises directing the precursor mixture toward and along the glass substrate, and reacting the mixture over the glass substrate to form a silica coating thereon.

In another embodiment, the process comprises providing a moving glass substrate. The glass substrate has a surface upon which the silica coating is to be deposited over. The process also comprises depositing a tin oxide coating on the surface of the glass substrate. A gaseous silane compound, oxygen, a radical scavenger and water vapor are mixed to form a gaseous precursor mixture. The process also comprises directing the gaseous precursor mixture toward and along the tin oxide coated surface of the glass substrate, reacting the mixture at or near the coated substrate surface to form a silica coating thereon and cooling the coated glass substrate to ambient temperature.

DETAILED DESCRIPTION OF THE INVENTION

It is to be understood that the invention may assume various alternative orientations and step sequences, except where expressly specified to the contrary. It is also to be understood that the specific articles and processes illustrated in the attached drawings, and described in the following specification are simply exemplary embodiments of the inventive concepts. Hence, specific dimensions, directions, or other physical characteristics relating to the embodiments disclosed are not to be considered as limiting, unless expressly stated otherwise.

In certain embodiments, a coated glass article for use as a superstrate in the manufacture of solar cells will be described. However, it would be understood by one of ordinary skill in the art that the coated glass article could also be utilized as a substrate in the manufacture of solar cells. Furthermore, the coated glass article described herein is not limited to solar cell applications. For example, the coated glass article may be utilized in architectural glazings, electronics, and/or have automotive and aerospace applications.

In an embodiment, a CVD process for depositing a coating of silica is provided. A non-limiting feature of an embodiment of the process is that it allows for the deposition of silica coatings at commercial viable deposition rates. For example, in certain embodiments, the silica coating can be deposited at a deposition rate of about 150 nm*m/min. or higher.

A silica coating, as defined herein, is a coating comprising primarily silicon and oxygen, and possibly containing trace contaminants, for example of carbon. In preferred embodiments, the silica coatings are stoichiometric silicon dioxide ($SiO_2$). However, silica coatings which are slightly oxygen deficient may also be produced and may be useful. Therefore, the silica coatings may be of another suitable stoichiometry.

In an embodiment, the CVD process comprises providing a glass substrate. The process may be carried out in conjunction with the manufacture of the glass substrate. In this embodiment, the glass substrate may be formed utilizing the well-known float glass manufacturing process. An example of a float glass manufacturing process is illustrated in FIG. 1. In this embodiment, the glass substrate may be a glass ribbon 8. However, it should be appreciated that the process can be utilized apart from the float glass manufacturing process or well after formation and/or further processing, such as cutting, of the substrate.

Preferably, the glass substrate is moving at the time of forming the silica coating. Thus, in certain embodiments the process is a dynamic deposition process. Additionally, in an embodiment, the temperature of the glass substrate is between about 1100° F. (600° C.) and 1400° F. (750° C.) when the silica coating is deposited thereon or thereover.

In an embodiment, the glass substrate is a soda-lime-silica glass. In this embodiment, the glass substrate may be substantially transparent. However, the process is not limited to use with transparent glass substrates as translucent glass substrates may also be utilized in practicing the process. Furthermore, the transparency of the substrate may vary based on the composition and thickness of the glass substrate. Thus, the process is not limited to a composition or thickness of the glass substrate as, for example, the process can be practiced utilizing clear, blue, green, grey, and bronze glass substrates. Additionally, glass substrates having varying absorption characteristics may be utilized in practicing the process. For example, it may be preferable to utilize a glass substrate having a low iron content.

The process also comprises forming a gaseous precursor mixture. The precursor mixture may include precursor materials suitable for forming the silica coating at essentially atmospheric pressure. Such materials may at some point be a liquid or a solid but are volatile such that they can be vaporized to form a gaseous precursor material for use in the precursor mixture.

The gaseous precursor mixture comprises a silane compound. In an embodiment, the silane compound maybe monosilane ($SiH_4$). However, the process is not limited to monosilane as other silane compounds are suitable for use in practicing the process.

The gaseous precursor mixture also comprises oxygen. In an embodiment, oxygen ($O_2$) may be provided as a part of a gaseous composition such as air. In another embodiment, oxygen is provided in a substantially purified form. In either embodiment, the oxygen is in the form of molecular oxygen.

In general, the deposition by CVD of a gaseous precursor stream containing only a silane compound produces a coating of amorphous silicon on a substrate. However, silane compounds may be pyrophoric and when oxygen alone is added to a pyrophoric silane compound, silica is produced, but it is produced at unacceptably high rates, resulting in an explosive reaction. Known methods of preventing such an explosive reaction result in deposition of coatings at very low, commercially impractical rates, typically resulting in unacceptably thin layers. Known methods are also limited in the amount of silane and oxygen which can be contained in the reactant mixture, as too high a concentration results in gas phase reaction of the elements, and no film being produced. Therefore, the gaseous precursor mixture comprises a radical scavenger.

The presence of the radical scavenger allows the silane compound to be premixed with the oxygen without undergoing ignition and premature reaction at the operating temperatures of the process. The radical scavenger further provides control of and permits optimization of the kinetics of the CVD reaction on the glass substrate. In an embodiment, the radical scavenger is a hydrocarbon gas. Preferably, the hydrocarbon gas is ethylene ($C_2H_4$) or propylene ($C_3H_6$). U.S. Pat. No. 5,798,142, which is incorporated by reference in its entirety herein, teaches the formation of a silica coating by combining a silane, oxygen, a radical scavenger and a carrier gas to form a precursor mixture.

The gaseous precursor mixture comprises water vapor. Although the process is not limited by the concentration of water vapor in the precursor mixture, it has been discovered that with the addition of high concentrations of water vapor, higher silica coating deposition rates than with, for example, molecular oxygen alone as the oxidant, are achieved. Thus, in an embodiment, the gaseous precursor mixture comprises about 10% or more of water vapor. In another embodiment, the gaseous precursor mixture comprises >10% of water vapor. Additionally, it has been discovered that in certain embodiments with higher concentrations of water vapor in the precursor mixture, for example >about 20%, that very significant increases in deposition rate are achieved. In yet a further embodiment, the precursor mixture comprises even higher percentages of water vapor. For example, the precursor mixture may comprise >40% water vapor. Preferably, in this embodiment, the precursor mixture comprises between 50% and 98% and even more preferably between 50% and 90% water vapor. Afforded benefits of including water vapor in the precursor gas mixture include dynamic deposition rates on the order of 12 nm/sec or about 150 nm*m/min. or higher.

In an embodiment, the gaseous precursor mixture comprises monosilane, oxygen, water vapor and ethylene. In this embodiment, the gaseous precursor mixture may comprises about 0.19% or more monosilane, about 0.4 to 0.8% or more oxygen, about 10% or more water vapor, and about 1.1% or more ethylene. Even more preferably, in this embodiment, the precursor mixture may comprise: about 0.21% or more monosilane, 0.8% or more oxygen, about 40% or more water vapor, and about 1.2% or more ethylene. In a further embodiment, the precursor mixture may comprise: about 0.19% to about 1.2% monosilane, 0.8% to about 4.8% oxygen, about 40% or more water vapor, and about 1.1% to about 7.2% ethylene.

Thus, in certain embodiments of the process the ratio of oxygen to silane compound in the precursor mixture may be about 4:1 or more. However, in other embodiments of the process, it may be preferable that the precursor mixture include high concentrations of water vapor and higher concentrations of oxygen. High concentrations of water vapor and higher concentrations of oxygen in the precursor mixture results in an increased deposition rate of the silica coating and may decrease the amount of reaction by-products which are generated during deposition of the silica coating. Therefore, in an embodiment, the precursor mixture may comprise a ratio of about 7:1 or more oxygen to silane compound. In further embodiments, the precursor mixture may comprise a ratio of about 10:1 or more oxygen to silane compound. In yet further embodiments, the precursor mixture may comprise a ratio of about 20:1 or more oxygen to silane compound. Also, as should be understood, water vapor and ethylene are also included in the precursor mixture for these embodiments and in the percentages described, above.

Preferably, in certain embodiments like the one shown in FIG. 1, the precursor mixture is introduced into a coating apparatus 9 prior to forming the silica coating. In this embodiment, the precursor mixture may be formed before the precursor materials are introduced into the coating apparatus 9. In this embodiment, the precursor materials may be mixed in a gas mixing chamber or the like to form the gaseous precursor mixture. For example, the precursor materials may be mixed in a feed line connected to an inlet of the coating apparatus 9. In other embodiments, the precursor mixture may be formed within the coating apparatus 9. Descriptions of coating apparatuses suitable for practicing the process can be found in U.S. patent application Ser. No. 13/426,697 and U.S. Pat. No. 4,922,853, the entire disclosures of which are hereby incorporated by reference.

The process also comprises directing the precursor mixture toward and along the glass substrate, and reacting the mixture over the glass substrate to form a silica coating thereon. The precursor mixture is preferably directed toward and along the glass substrate in a laminar flow. Also, the precursor mixture is preferably reacted at or near the surface of the glass substrate to form the silica coating while the glass substrate moves at a predetermined rate of, for example, >125 in/min (3.175 m/min). In another embodiment, the glass substrate is moving at a rate of between 125 in/min and 600 in/min (15.24 m/min).

As discussed, above, the process may be carried out in conjunction with the manufacture of the glass substrate in the well-known float glass manufacturing process. The float glass manufacturing process is typically carried out utilizing a float glass installation 10, which is described herein and shown in FIG. 1. However, it should be understood that while FIG. 1 is illustrative of such installations it is not limiting to the invention.

The float glass installation 10 more particularly comprises a canal section 20 along which molten glass 19 is delivered from a melting furnace, to a float bath section 11 wherein the glass substrate is formed. In this embodiment, the glass substrate will be referred to as a glass ribbon 8. The glass ribbon 8 is a preferable substrate on which the silica coating is deposited. However, it should be appreciated that the glass substrate is not limited to being a glass ribbon 8.

The glass ribbon 8 advances from the bath section 11 through an adjacent annealing lehr 12 and a cooling section 13. The float bath section 11 includes: a bottom section 14 within which a bath of molten tin 15 is contained, a roof 16, opposite side walls (not depicted) and end walls 17. The roof 16, side walls and end walls 17 together define an enclosure in which a non-oxidizing atmosphere is maintained to prevent oxidation of the molten tin 15.

In operation, the molten glass 19 flows along the canal 20 beneath a regulating tweel 21 and downwardly onto the surface of the tin bath 15 in controlled amounts. On the molten tin surface, the molten glass 19 spreads laterally under the influence of gravity and surface tension, as well as certain mechanical influences, and it is advanced across the tin bath 15 to form the glass ribbon 8. The glass ribbon 8 is removed from the bath section 11 over lift out rolls 22 and is thereafter conveyed through the annealing lehr 12 and the cooling section 13 on aligned rolls. The deposition of the silica coating preferably takes place in the float bath section 11, although it may be possible for deposition to take place further along the glass production line, for example, in a gap 28 between the float bath 11 and the annealing lehr 12, or in the annealing lehr 12.

The silica coating is preferably formed at essentially atmospheric pressure. Thus, the pressure of the float bath section 11, annealing lehr 12, and/or or in the gap 28 between the float bath 11 and the annealing lehr 12 may be essentially atmospheric pressure. However, the process is not limited to an atmospheric CVD process. Thus, the silica coating may be formed under low-pressure conditions.

A suitable non-oxidizing atmosphere, generally nitrogen or a mixture of nitrogen and hydrogen in which nitrogen predominates, is maintained in the float bath section 11 to prevent oxidation of the molten tin 15 comprising the float bath. The atmosphere gas is admitted through conduits 23 operably coupled to a distribution manifold 24. The non-oxidizing gas is introduced at a rate sufficient to compensate for normal losses and maintain a slight positive pressure, on the order of between about 0.001 and about 0.01 atmosphere above ambient atmospheric pressure, so as to prevent infiltration of outside atmosphere. For purposes of the invention, the above-noted pressure range is considered to constitute normal atmospheric pressure.

Heat for maintaining the desired temperature regime in the float bath 11 and the enclosure is provided by radiant heaters 25 within the enclosure. The atmosphere within the lehr 12 is typically atmospheric air, as the cooling section 13 is not enclosed and the glass ribbon 8 is therefore open to the ambient atmosphere. After forming the coating layer(s), the coated glass substrate is subsequently allowed to cool to ambient temperature. To cool the coated glass substrate, ambient air may be directed against the glass ribbon 8 as by fans 26 in the cooling section 13. Heaters (not depicted) may also be provided within the annealing lehr 12 for causing the temperature of the glass ribbon 8 to be gradually reduced in accordance with a predetermined regime as it is conveyed therethrough.

In an embodiment, a coating apparatus 9 is provided to direct the gaseous precursor gas mixture toward and along the glass substrate. The coating apparatus 9 may include one or more gas distributor beams. It should be appreciated that a plurality of coating apparatuses, and thus additional gas distributor beams, may be provided for supplying precursor materials to form additional coating layers over the glass substrate. In certain embodiments, the coating apparatus 9 is preferably provided within the float bath section 11, the annealing lehr 12, and/or in the gap 28 between the float bath 11 and the annealing lehr 12 and extends transversely across the glass substrate. Depending on the thickness of the silica coating required, the silica coating formed by the process may be deposited by forming a plurality of silica coating layers consecutively. However, due to the improvements offered by the process, a single coating apparatus may only be required for forming the silica coating.

The process results in the deposition of a high quality silica coating being formed over the glass substrate. In an embodiment, the silica coating is a pyrolytic coating. In another embodiment, the silica coating is formed directly on the glass substrate. However, the highest silica coating growth rates of the process are achieved when the silica coating was formed directly on a previously deposited tin oxide coating ($SnO_2$). Therefore, in an embodiment, the silica coating is formed directly on a tin oxide coating. In this embodiment, the tin oxide coating has been previously deposited over a surface of the glass substrate. Thus, the tin oxide coating, over which the silica coating is to be deposited, may be deposited directly on the glass substrate.

The tin oxide coating may be formed shortly before forming the silica coating. In an embodiment, the tin oxide coating may be formed in conjunction with the float glass manufacturing process. However, it should be appreciated that the tin oxide coating may be formed utilizing another manufacturing process. When the tin oxide coating is formed in conjunction with the float glass manufacturing process, the tin oxide coating may be deposited by chemical vapor deposition, utilizing a coating apparatus 9A and/or at essentially atmospheric pressure. In these embodiments, the deposition of the tin oxide coating preferably takes place in the float bath section 11. However, as should be appreciated, the tin oxide coating may be formed utilizing another deposition process, under low-pressure conditions, and without the use of a coating apparatus.

In an embodiment, the tin oxide coating is a pyrolytic coating. The tin oxide coating may be formed using halogen containing tin precursor compound, preferably a Cl— containing precursor compound. Preferred Cl— containing precursor compounds for use in forming the tin oxide coating are dimethyltin dichloride (DMT) and tin tetrachloride ($SnCl_4$).

In an embodiment, the tin oxide coating has been deposited directly on the glass substrate at a thickness between 5 nm and 100 nm. Preferably, in this embodiment, the tin oxide coating has been deposited at a thickness of about 25 nm. Thus, in the embodiments where a tin oxide coating has been deposited prior to forming the silica layer, at least two discrete coating layers are deposited on the glass substrate.

As described, in certain embodiments, the coated glass article may be of a glass/silica or glass/tin oxide/silica arrangement. However, the process may be utilized in combination with one or more additional coating layers to achieve a desired coating stack. The additional coating layer(s) may be formed in conjunction with the float glass manufacturing process shortly after forming the silica coating and/or as part of another manufacturing process. Also, these additional coating layers may be formed by pyrolysis or by another coating deposition process.

As an example, additional coating layer(s) of thin-film photovoltaic materials, or other semiconductor materials, may be formed over the silica coating layer so as to provide a desired coating stack. The photovoltaic materials, or other semiconductor materials, may be formed over the coated glass article during the manufacturing of solar cells. Since the silica coating of the process is of high quality, the coated glass article of the may provide higher visible light transmission than previously known coated glass articles having the same coating stack but a silica coating formed by a different process. Thus, utilizing the coated glass article in solar cell manufacturing may result in higher solar cell efficiency and/or greater power output.

Additionally, coating layer(s) of other materials may be deposited over the silica coating layer so as to provide a coating stack, and therefore coated glass articles, with high conductivity, low emissivity and/or anti-reflective properties. In an embodiment, these additional materials may be transparent conductive metal oxides (TCOs). Examples of such TCO materials are fluorine doped tin oxide ($SnO_2$:F) and aluminum doped zinc oxide (ZnO:Al). However, in certain embodiments, the transparent metal oxide materials need not be conductive in order to achieve a desired coating stack. In these embodiments, transparent metal oxide materials such as tin oxide, additional layers of silica, iron oxide ($Fe_2O_3$), and titanium dioxide ($TiO_2$) may be formed over the silica coating.

EXAMPLES

In TABLES 1, 2, and 3, the columns illustrating the properties of the silica coatings and the features of the silica deposition processes relating thereto are designated with an SiO₂. Examples within the scope of the invention are listed in TABLE 1, TABLE 2 and TABLE 3 as Ex 1-Ex 21. However, Ex 1-Ex 21 are for illustrative purposes only and are not to be construed as a limitation on the invention. Comparative examples, not considered to be a part of the invention are designated as C1 and C2.

The following experimental conditions are applicable to C1, C2 and Ex 1-Ex 21.

The coated glass articles in C1, C2 and Ex 1-Ex 21 are of a glass/SnO₂/silica/SnO₂:F arrangement. The coated glass articles described in TABLES 1, 2 and 3 were deposited on a moving glass substrate in conjunction with the float glass manufacturing process. For C1, C2 and Ex 1-Ex 21 prior to forming the silica coating, a pyrolytic SnO₂ coating was deposited at a thickness of about 25 nm over the glass substrate. The SnO₂ coating was formed utilizing DMT. After forming the silica coating, a pyrolytic SnO₂:F coating was deposited at a thickness of about 340 nm over the silica coating.

Total gas flow of all constituents of the gaseous precursor mixture was 166 liters per minute per meter of gas distributor beam perpendicular to glass substrate travel (l/min/m) for C1, C2 and Ex 1-Ex 15 and 224 l/min/m for Ex 16-Ex 21. The amounts of the individual gaseous precursor materials are as listed in TABLES 1, 2 and 3. Line speeds, i.e. the speed of the glass substrate moving beneath the coating apparatus from which the precursor gases are delivered, were 5.94 m/min. and 10.5 m/min, respectively.

Deposition rates for purposes of this application are expressed in two ways:

(1) Dynamic Deposition Rate (DDR) equals the thickness of the silica coating in nm multiplied by the line speed in m/min. and is expressed as nm*m/min. The DDR is useful for comparing coating deposition rates at different line speeds.

(2) Concentration Adjusted—Dynamic Deposition Rate (CA-DDR) equals the DDR divided by the concentration of silane (% SiH₄) available in the precursor mixture. The CA-DDR is expressed as (nm*m/min)/% SiH₄ and is useful for comparing deposition rates, in this case of silica coatings, having different precursor concentrations at different line speeds.

The silica coating thicknesses reported in TABLES 1, 2 and 3 were calculated using reflection. Also, for the examples where it was reported, % Improvement is a comparison of the CA-DDRs of the known processes (C1, C2) and the CA-DDRs of the process described herein. Whereas, % Tvis is the total visible light transmission of the coated glass article produced by comparative silica deposition process C2 and the presently described process and is expressed as a percentage.

TABLE 1

Line Speed—5.94 m/min

| Examples Comp. Ex | Total Flow l/min/m | % SiH₄ | % O₂ | % C₂H₄ | % N₂ | % H₂O | Thickness SiO₂ (nm) | DDR SiO₂ nm * m/min | CA-DDR (nm * (m/min))/ % SiH₄ | % Improvement | % Tvis |
|---|---|---|---|---|---|---|---|---|---|---|---|
| C1 | 166 | 0.28 | 1.1 | 1.7 | 96.9 | 0.0 | 24.7 | 147 | 52810 | — | — |
| Ex 1 | 166 | 0.28 | 1.1 | 1.7 | 87.1 | 9.8 | 24.9 | 148 | 53238 | .8 | 85.2 |
| Ex 2 | 166 | 0.21 | 0.8 | 2.5 | 37.4 | 59.0 | 21.4 | 127 | 61593 | 16.6 | — |
| Ex 3 | 166 | 0.28 | 1.1 | 1.7 | 77.3 | 19.7 | 26.8 | 159 | 57300 | 8.5 | 85.3 |
| Ex 4 | 166 | 0.28 | 1.1 | 1.7 | 67.4 | 29.5 | 28.5 | 169 | 60935 | 15.4 | 85.2 |
| Ex 5 | 166 | 0.28 | 1.1 | 1.7 | 57.6 | 39.4 | 30.0 | 178 | 64142 | 21.5 | 85.4 |
| Ex 6 | 166 | 0.28 | 1.1 | 1.7 | 47.7 | 49.2 | 31.3 | 186 | 66922 | 26.7 | |
| Ex 7 | 166 | 0.28 | 1.1 | 1.7 | 37.9 | 59.0 | 33.0 | 196 | 70556 | 33.6 | |
| Ex 8 | 166 | 0.28 | 1.1 | 1.7 | 37.9 | 59.0 | 38.0 | 226 | 81247 | 53.9 | 85.6 |
| Ex 9 | 166 | 0.21 | 0.8 | 1.2 | 38.7 | 59.0 | 26.4 | 157 | 75984 | 44.9 | 85.4 |

TABLE 2

Line Speed—10.5 m/min

| Examples Comp. Ex | Total Flow l/min/m | % SiH₄ | % O₂ | % C₂H₄ | % N₂ | % H₂O | Thickness SiO₂ (nm) | DDR SiO₂ nm * m/min | CA-DDR (nm * (m/min))/ % SiH₄ | % Improvement | % Tvis |
|---|---|---|---|---|---|---|---|---|---|---|---|
| C2 | 166 | 0.57 | 2.3 | 3.4 | 93.7 | 0.0 | 24.8 | 259 | 45291 | — | 86.1 |
| Ex 10 | 166 | 0.36 | 1.4 | 2.1 | 17.3 | 78.7 | 25.7 | 268 | 75101 | 65.8 | |
| Ex 11 | 166 | 0.34 | 1.4 | 2.0 | 17.5 | 78.7 | 25.5 | 266 | 77981 | 72.2 | 86.2 |
| Ex 12 | 166 | 0.57 | 2.3 | 3.4 | 74.0 | 19.7 | 28.8 | 301 | 52703 | 16.4 | 86.3 |
| Ex 13 | 166 | 0.57 | 2.3 | 3.4 | 54.3 | 39.4 | 32.0 | 335 | 58558 | 29.3 | 86.4 |
| Ex 14 | 166 | 0.57 | 2.3 | 3.4 | 34.7 | 59.0 | 33.3 | 348 | 60842 | 34.3 | 86.5 |
| Ex 15 | 166 | 0.57 | 2.3 | 3.4 | 15.0 | 78.7 | 36.5 | 381 | 66702 | 47.3 | 86.7 |

TABLE 3

Line Speed—10.5 m/min

| Examples Comp. Ex | Total Flow l/min/m | % SiH₄ | % O₂ | % C₂H₄ | % N₂ | % H₂O | Thickness SiO₂ (nm) | DDR SiO₂ nm * m/min | CA-DDR (nm * (m/min))/ % SiH₄ |
|---|---|---|---|---|---|---|---|---|---|
| Ex 16 | 224 | 0.21 | 0.8 | 1.3 | 39.3 | 58.4 | 22.0 | 230 | 108635 |
| Ex 17 | 224 | 0.21 | 1.5 | 1.3 | 38.7 | 58.4 | 24.0 | 251 | 118511 |

TABLE 3-continued

Line Speed—10.5 m/min

| Examples Comp. Ex | Total Flow l/min/m | % SiH$_4$ | % O$_2$ | % C$_2$H$_4$ | % N$_2$ | % H$_2$O | Thickness SiO$_2$ (nm) | DDR SiO$_2$ nm * m/min | CA-DDR (nm * (m/min))/ % SiH$_4$ |
|---|---|---|---|---|---|---|---|---|---|
| Ex 18 | 224 | 0.21 | 2.1 | 1.3 | 38.0 | 58.4 | 26.0 | 272 | 128387 |
| Ex 19 | 224 | 0.21 | 3.2 | 1.3 | 37.0 | 58.4 | 26.5 | 277 | 130856 |
| Ex 20 | 224 | 0.19 | 3.8 | 1.1 | 36.6 | 58.4 | 24.0 | 251 | 133325 |
| Ex 21 | 224 | 0.19 | 4.7 | 1.1 | 35.6 | 58.4 | 24.0 | 251 | 133325 |

As shown by Ex 1-Ex 21, the process provides an improved process over comparative silica deposition processes C1 and C2. For example, the silica film thickness for comparative silica deposition process C2 was 24.8 nm at a mol % of 0.57 for SiH$_4$ in the gaseous precursor mixture. However, for ex 10 and ex 11, the silica film thickness was 25.7 and 25.5, respectively. This is despite the mol % for SiH$_4$ in the gaseous precursor mixture of ex 10 and ex 11 being only 0.36 and 0.34, respectively. Also, as shown by the silica deposition rates of Ex 1 and Ex 3-Ex 7 and comparative silica deposition process C1, when the mol % s for SiH$_4$ are equal in the gaseous precursor mixture, the silica deposition rate of the process is greater than that of the comparative deposition process.

Additionally, Ex 1 and Ex 3-Ex 7 show the effect of increased water vapor in the precursor mixture on silica deposition rate. As illustrated, as the % of water vapor increases in the precursor mixture the silica deposition rate also increases. As can be observed from Ex 1 and Ex 3-Ex 9 in TABLE 1, when the ratio of SiH$_4$ to O$_2$ and C$_2$H$_4$ is kept relatively equal, for example, at a 1-4-6 ratio, additional water vapor in the gaseous precursor mixture generally results in increases in the silica coating thickness and improvement in the silica deposition rate. For example, Ex 12-Ex 15 in TABLE 2 show significant increases in silica coating thickness and silica deposition rate in excess of 16% over the comparative deposition process C2. As can also be observed from comparing the silica deposition rate of Ex 1 with Ex 3-Ex 9, increasing water content generally results in substantial increases in silica coating thickness and improvement in silica deposition rate of 8.5% and higher. Additionally, further increases in the mol % of water vapor in the gaseous precursor mixture generally results in increases in the silica coating thickness and improvement in the silica deposition rate. For example, Ex 12-Ex 15 in TABLE 2 show significant increases in silica coating thickness and silica deposition rate in excess of 16% over the comparative deposition process C2.

Thus, as illustrated, the process provides a more efficient deposition process which produces a better silica deposition rate over the comparative deposition processes.

TABLE 3 illustrates the benefits of using high concentrations of water vapor and higher concentrations of oxygen in the process. In Ex. 16, the silica coating was deposited at a DDR of 230 nm*m/min when the concentration of water vapor in the precursor mixture was 58.4 and the ratio of oxygen to silane compound in the precursor mixture was at about 4:1. However, as illustrated by Ex 17-Ex 21, as the ratio of oxygen to silane compound increases in the precursor mixture, the DDR increases. For example, in Ex 17 the silica coating was deposited at a DDR of 251 nm*m/min. In this example, the % of water vapor in the precursor mixture was maintained at 58.4 but the ratio of oxygen to silane compound in the precursor mixture was at about 7:1. In Ex 18, the silica coating was deposited at a DDR of 272 nm*m/min while the concentration of water vapor was maintained at 58.4%. However, the ratio of oxygen to silane compound in the precursor mixture was increased to be at about 10:1. Further increases in the silica coating were observed in Ex 19 where the silica coating was deposited at a DDR of 277 nm*m/min when the ratio of oxygen to silane compound in the precursor mixture was at about 15:1. In Ex 20, the ratio of oxygen to silane compound in the precursor mixture was at about 20:1 and the silica coating was deposited at a DDR of 251 nm*m/min. Ex 21 illustrates that the improvement in the silica coating DDR can be achieved when the when the ratio of oxygen to silane compound in the precursor mixture is more than 20:1.

Furthermore, the coated glass articles having been formed by the process have higher visible light transmission when compared with the coated glass articles provided by the comparative deposition processes. For example, as shown in TABLE 2, the visible light transmission for the coated glass articles of ex 11-ex 15 is greater than the visible light transmission for comparative deposition process C2.

The foregoing description is considered as illustrative only of the principles of the invention. Further, since numerous modifications and changes will readily occur to those skilled in the art, it is not desired to limit the invention to the exact construction and processes shown and described herein. Accordingly, all suitable modifications and equivalents may be considered as falling within the scope of the invention as defined by the claims which follow.

What is claimed is:

1. A chemical vapor deposition process for depositing a coating of silica, comprising:
   providing a glass substrate;
   forming a gaseous precursor mixture comprising a silane compound, oxygen, water vapor, and a radical scavenger, wherein the gaseous precursor mixture comprises 10% or more water vapor; and
   directing the precursor mixture toward and along the glass substrate, and reacting the mixture over the glass substrate to form a silica coating thereon.

2. The chemical vapor deposition process defined in claim 1, wherein the gaseous precursor mixture comprises 40% or more water vapor.

3. The chemical vapor deposition process defined in claim 1, wherein the silica coating is formed at a deposition rate of about 150 nm*m/min. or higher.

4. The chemical vapor deposition process defined in claim 1, wherein a surface of the substrate is at substantially atmospheric pressure when the silica coating is formed thereon.

5. The chemical vapor deposition process defined in claim 1, further comprising depositing a tin oxide coating on a surface of the glass substrate, wherein the silica coating is deposited over the tin oxide coating.

6. The chemical vapor deposition process defined in claim 1, wherein the gaseous precursor mixture is formed before being introduced into a coating apparatus.

7. The chemical vapor deposition process defined in claim 1, wherein the glass substrate is between about 1100° F. (600° C.) and 1400° F. (750° C.) when the silica coating is deposited thereon.

8. The chemical vapor deposition process defined in claim 1, wherein the glass substrate is moving when the silica coating is deposited.

9. The chemical vapor deposition process defined in claim 2, wherein the gaseous precursor mixture comprises between 50% and 98% water vapor.

10. The chemical vapor deposition process defined in claim 2, wherein the gaseous precursor mixture comprises oxygen and the silane compound at a ratio of greater than 4:1.

11. The chemical vapor deposition process defined in claim 8, wherein the glass substrate is moving at a rate of between 125 in/min (3.175 m/min) and 600 in/min (15.24 m/min).

12. A chemical vapor deposition process for depositing a silica coating comprising the steps of:
   providing a moving glass substrate having a surface upon which the silica coating is to be deposited over;
   depositing a tin oxide coating on the surface of the glass substrate;
   mixing a gaseous silane compound, oxygen, radical scavenger and water vapor, to form a gaseous precursor mixture which comprises about 10% or more water vapor;
   directing the gaseous precursor mixture toward and along the tin oxide coated surface of the glass substrate, reacting the mixture at or near the coated substrate surface to form a silica coating thereon; and
   cooling the coated glass substrate to ambient temperature.

13. The chemical vapor deposition process defined in claim 12, wherein the surface of the glass substrate is at substantially atmospheric pressure when the tin oxide and silica coatings are deposited thereover.

14. The chemical vapor deposition process defined in claim 12, wherein the tin oxide coating is deposited to have a thickness between 5 nm and 100 nm and directly on the surface of the glass substrate.

15. The chemical vapor deposition process defined in claim 12, wherein the tin oxide coating is deposited using a halogen containing tin precursor compound.

16. The chemical vapor deposition process defined in claim 12, wherein the glass substrate is between about 1100° F. (600° C.) and 1400° F. (750° C.) when the silica coating is deposited thereover.

17. The chemical vapor deposition process defined in claim 12, where the glass substrate is moving at a rate of between 125 in/min and 600 in/min.

18. The chemical vapor deposition process defined in claim 12, where the tin oxide and silica coatings form two discrete coating layers on the glass substrate.

* * * * *